United States Patent
Kogure et al.

(10) Patent No.: US 10,658,555 B2
(45) Date of Patent: May 19, 2020

(54) OPTICAL SEMICONDUCTOR APPARATUS

(71) Applicant: HOYA CANDEO OPTRONICS CORPORATION, Toda-shi, Saitama (JP)

(72) Inventors: Yasuo Kogure, Toda (JP); Shinichi Ogawa, Toda (JP); Satoshi Yajima, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 0 days.

(21) Appl. No.: 16/140,159

(22) Filed: Sep. 24, 2018

(65) Prior Publication Data
US 2019/0103529 A1   Apr. 4, 2019

(30) Foreign Application Priority Data

Sep. 29, 2017   (JP) .................. 2017-190720

(51) Int. Cl.
*H01L 33/00* (2010.01)
*H01L 33/56* (2010.01)
*H01L 33/36* (2010.01)
*H01L 33/44* (2010.01)
*H01L 33/62* (2010.01)
*H01L 33/54* (2010.01)

(52) U.S. Cl.
CPC .............. *H01L 33/56* (2013.01); *H01L 33/36* (2013.01); *H01L 33/44* (2013.01); *H01L 33/54* (2013.01); *H01L 33/62* (2013.01)

(58) Field of Classification Search
CPC ......... H01L 33/36; H01L 33/56; H01L 33/44; H01L 33/54
See application file for complete search history.

(56) References Cited

U.S. PATENT DOCUMENTS

| | | | | |
|---|---|---|---|---|
| 2005/0238278 A1* | 10/2005 | Nakashiba | .............. | B32B 15/08 385/14 |
| 2007/0199811 A1* | 8/2007 | Hotta | ..................... | H01H 35/02 200/310 |
| 2010/0321920 A1* | 12/2010 | Wu | ......................... | H01L 33/54 362/84 |
| 2013/0119426 A1* | 5/2013 | Katoh | ................... | H01L 33/486 257/98 |

(Continued)

FOREIGN PATENT DOCUMENTS

| | | |
|---|---|---|
| JP | 2003-176334 A | 6/2003 |
| JP | 2010-059359 A | 3/2010 |

*Primary Examiner* — Phuc T Dang
(74) *Attorney, Agent, or Firm* — Rabin & Berdo, P.C.

(57) ABSTRACT

Provided is an optical semiconductor apparatus including an optical semiconductor device; a light-permeable buffer layer that contains a cured high-hardness silicone resin, that has a thickness ranging from 1 μm to 300 μm, and that covers at least part of a light-emitting surface of the optical semiconductor device; and a flexible sealing layer containing a cured flexible silicone resin that has a lower hardness than the light-permeable buffer layer, and that covers the optical semiconductor device and the light-permeable buffer layer. The optical semiconductor apparatus has superior heat resistance and UV resistance and is significantly prevents the breakage of a wire electrically connected to the optical semiconductor device.

19 Claims, 2 Drawing Sheets

(56) References Cited

U.S. PATENT DOCUMENTS

2014/0322844 A1* 10/2014 Ichikawa ............ H01L 33/0079
                                                        438/29
2016/0233395 A1*  8/2016 Miyamoto ........... C08K 5/3472
2018/0010784 A1*  1/2018 Kim .................... F21V 29/70

\* cited by examiner

OPTICAL SEMICONDUCTOR APPARATUS

TECHNICAL FIELD

The present disclosure relates to an optical semiconductor apparatus, e.g., an ultraviolet LED (light-emitting diode).

BACKGROUND ART

Recently, LEDs emitting light of short wavelength, such as a blue LED, an ultraviolet LED, etc., have been developed and provided for practical use. These LEDs are used in wide applications including, for example, in lighting and illumination, replacing the existing fluorescent lamps or incandescent lamps, and as light sources for curing UV-curable resins or UV-curable inks, replacing the existing short arc lamps.

In general, an LED has an LED die having an anode and a cathode formed on the surface thereof. The anode and the cathode are respectively wire-bonded to an external electrode and the LED die emits light as it is electrically connected to the external electrode.

If the LED die and the ultrafine wire (with a diameter of, e.g., 30 μm) of the LED are exposed to outside, the LED die may be damaged or the wire may be broken. For this reason, the LED is usually sealed with a sealer (e.g., a resin).

The sealing of the LED with a sealer is also effective in improving light extraction efficiency because, if the LED is sealed with a sealer with a higher refractive index than air, the difference in refractive indices at the interface of the LED die and the sealer is decreased.

As the sealer, an epoxy resin with high transparency has been used for LEDs emitting visible light (see, for example, the patent document 1). However, if the epoxy resin is used for LEDs emitting short-wavelength light, the resin itself may be deteriorated by the short-wavelength light, particularly the strong UV light emitted from the ultraviolet LED, which is used as a light source for curing UV-curable resins or UV-curable inks, resulting in coloration or cracking and thus decreased light emission.

For this reason, a silicone resin with superior heat resistance and light resistance has been proposed as the sealer (see, for example, the patent document 2).

REFERENCES OF RELATED ART

Patent Documents

Japanese Patent Publication No. 2003-176334.
Japanese Patent Publication No. 2010-059359.

DISCLOSURE

Technical Problem

As a silicone resin that can be used as a sealer, one which is capable of exhibiting flexibility after curing (cured flexible silicone resin) and one which exhibits high hardness after curing (cured high-hardness silicone resin) may be considered. Because the cured high-hardness silicone resin exhibits higher heat resistance and UV resistance than the cured flexible silicone resin, both an LED die and a wire contacting the LED die may be sealed with the cured high-hardness silicone resin.

However, the inventors of the present disclosure have found out that, although the cured high-hardness silicone resin has superior heat resistance and UV resistance, cracking may occur easily due to high hardness, the wire may be broken easily when the cracking occurs and the wire may be broken easily due to fatigue as the high-hardness silicone resin is expanded and shrunk during switch on-off.

The present disclosure has been made in consideration of these circumstances and is directed to providing an optical semiconductor apparatus which has superior heat resistance and UV resistance and is capable of preventing the breakage of a wire electrically connected to an optical semiconductor device.

Technical Solution

The inventors of the present disclosure have found out that the above-described technical problem can be solved by an optical semiconductor apparatus having an optical semiconductor device, a light-permeable buffer layer containing a cured high-hardness silicone resin having a thickness of 1-300 μm, which covers at least part of a light-emitting surface of the optical semiconductor device, and a flexible sealing layer containing a cured flexible silicone resin having a lower hardness than the light-permeable buffer layer, which covers the optical semiconductor device and the light-permeable buffer layer, and completed the present disclosure.

That is to say, the present disclosure provides:

(i) an optical semiconductor apparatus having an optical semiconductor device, a light-permeable buffer layer containing a cured high-hardness silicone resin having a thickness of 1-300 μm, which covers at least part of a light-emitting surface of the optical semiconductor device, and a flexible sealing layer containing a cured flexible silicone resin having a lower hardness than the light-permeable buffer layer, which covers the optical semiconductor device and the light-permeable buffer layer, (ii) the optical semiconductor apparatus of (i), wherein the optical semiconductor device has an electrode installed on at least part of the light-emitting surface and a wire electrically connected to the electrode (iii) the optical semiconductor apparatus of (i) or (ii), wherein the light-permeable buffer layer has an IRHD hardness of 60 or higher and the flexible sealing layer has an IRHD hardness of 20 or lower, (iv) the optical semiconductor apparatus of any of (i) to (iii), wherein a ratio of the IRHD hardness of the light-permeable buffer layer to the IRHD hardness of the flexible sealing layer is 6 or greater, (v) the optical semiconductor apparatus of any of (i) to (iv), wherein the cured flexible silicone resin or the cured high-hardness silicone resin is a cured alkoxy oligomer having an organopolysiloxane structure which is liquid at room temperature, wherein the alkoxy oligomer has one or more structural unit selected from a structural unit represented by the general formula (1)

$$(R^1R^2R^3SiO_{1/2}) \quad (1)$$

(wherein each of $R^1$, $R^2$ and $R^3$ is the same or different organic group), a structural unit represented by the general formula (2)

$$(R^4R^5SiO_{2/2}) \quad (2)$$

(wherein each of $R^4$ and $R^5$ is the same or different organic group), a structural unit represented by the general formula (3)

$$(R^6SiO_{3/2}) \quad (3)$$

(wherein $R^6$ is an organic group) and a structural unit represented by the general formula (4)

$$(SiO_{4/2}) \quad (4)$$

as an essential constituent, and
has one or more structural unit selected from
a structural unit represented by the general formula (5)

$$(R^7_a(OR^8)_{3-a}SiO_{1/2}) \quad (5)$$

(wherein a is 0, 1 or 2 and each of $R^7$ and $R^8$ is the same or different organic group, with the proviso that, if $R^7$ or $R^8$ is plural, the respective $R^7$ or $R^8$ may be identical to or different from each other),
a structural unit represented by the general formula (6)

$$(R^9_b(OR^{10})_{2-b}SiO_{2/2}) \quad (6)$$

(wherein b is 0 or 1 and each of $R^9$ and $R^{10}$ is the same or different organic group, with the proviso that, if $R^{10}$ is plural, the respective $R^{10}$ may be identical to or different from each other) and
a structural unit represented by the general formula (7)

$$((OR^{11})SiO_{3/2}) \quad (7)$$

(wherein $R^{11}$ is an organic group)
as an optional constituent,
(vi) the optical semiconductor apparatus of (v), wherein the alkoxy oligomer contains 0-5 mol % of the structural unit represented by the general formula (1), 0-70 mol % of the structural unit represented by the general formula (2), 30-100 mol % of the structural unit represented by the general formula (3) and 0-10 mol % of the structural unit represented by the general formula (4) based on 100 mol % of the total siloxane units of the alkoxy oligomer forming the cured high-hardness silicone resin,
(vii) the optical semiconductor apparatus of (v) or (vi), wherein a ratio of A to B, wherein A is the ratio of the mole of the structural unit represented by the general formula (2) to the mole of the structural unit represented by the general formula (3) in the structural units of the alkoxy oligomer forming the cured high-hardness silicone resin and B is the ratio of the mole of the structural unit represented by the general formula (2) to the mole of the structural unit represented by the general formula (3) in the structural units of the alkoxy oligomer forming the cured flexible silicone resin, is 0.1 or smaller,
(viii) the optical semiconductor apparatus of any of (i) to (viii), wherein one or more organic group selected from $R^1$, $R^2$, $R^3$, $R^4$, $R^5$, $R^6$, $R^7$, $R^8$, $R^9$, $R^{10}$ and $R^{11}$ is a methyl group,
(ix) the optical semiconductor apparatus of any of (i) to (viii), wherein the light-permeable buffer layer is formed of a cured product of a solution containing an alkoxy oligomer having an organopolysiloxane structure which forms the cured high-hardness silicone resin, wherein the solution containing the alkoxy oligomer does not show fluidity when provided for a curing test of
(a) dropping 30 μL of the solution on a glass substrate,
(b) keeping the glass substrate at 150° C. for 1 hour,
(c) cooling the heat-treated glass substrate to room temperature, and
(d) vertically standing the glass substrate and keeping for 10 minutes,
(x) the optical semiconductor apparatus of any of (i) to (ix), wherein the flexible sealing layer has a shape of an optical device, and
(xi) the optical semiconductor apparatus of any of (i) to (x), which emits ultraviolet light with a peak emission wavelength shorter than 395 nm.

Advantageous Effects

As described above, an apparatus wherein a semiconductor device is sealed using a cured high-hardness silicone resin has the problem that cracking may occur easily in the sealed portion although heat resistance and UV resistance are superior. However, the optical semiconductor apparatus of the present disclosure has a layer (buffer layer) wherein the cured high-hardness silicone resin, which is very thin with a thickness of 1-300 μm, and the buffer layer is sealed with a flexible sealing layer containing a cured flexible silicone resin which has a lower hardness than the buffer layer. The optical semiconductor apparatus of the present disclosure exhibits effectively decreased internal stress in the layer with a higher hardness as compared to an apparatus wherein a semiconductor device is sealed with only one layer using the cured high-hardness silicone resin with a high hardness, because the volume of the layer with a higher hardness (i.e., the layer which is more susceptible to cracking) is small. Therefore, the optical semiconductor apparatus of the present disclosure has superior crack resistance as well as superior heat resistance and UV resistance.

In addition, because the optical semiconductor apparatus of the present disclosure has a double-layer structure consisting of the buffer layer and the flexible sealing layer containing the cured flexible silicone resin, a crack formed in the buffer layer is difficult to be propagated from the buffer layer to the flexible sealing layer. That is to say, in the optical semiconductor apparatus of the present disclosure, crack growth is effectively prevented as compared to the apparatus wherein the semiconductor device sealed with only one layer with a high hardness using the cured high-hardness silicone resin.

Also, in the optical semiconductor apparatus of the present disclosure, the flexible sealing layer containing the cured flexible silicone resin is spaced apart from the light-emitting surface of the optical semiconductor device by the thickness of the buffer layer. For this reason, the intensity of the light irradiated from the light-emitting surface to the flexible sealing layer and the thermal effect on the flexible sealing layer caused by the light are effectively reduced. Accordingly, the optical semiconductor device of the present disclosure has superior heat resistance and UV resistance.

In addition, because the thickness of the light-permeable buffer layer formed on the semiconductor device of the optical semiconductor apparatus of the present disclosure is as small as 1-300 μm, although an electrode is present on the upper surface of the semiconductor device and a wire connecting the electrode to an electrode of a substrate is installed, only a very small portion of the wire is covered by the light-permeable buffer layer. As such, because the contact area of the wire and the cured high-hardness silicone resin is decreased in the optical semiconductor apparatus of the present disclosure as compared to an apparatus wherein the semiconductor device is entirely covered with the cured high-hardness silicone resin, the stress occurring in the wire due to the cured high-hardness silicone resin can be reduced. Through this, the breakage of the wire during the use of the apparatus can be significantly prevented.

BEST MODE FOR CARRYING OUT INVENTION (Mode for Carrying out Invention)

An optical semiconductor apparatus according to the present disclosure has an optical semiconductor device, a light-permeable buffer layer containing a cured high-hardness silicone resin having a thickness of 1-300 µm, which covers at least part of a light-emitting surface of the optical semiconductor device, and a flexible sealing layer containing a cured flexible silicone resin having a lower hardness than the light-permeable buffer layer, which covers the optical semiconductor device and the light-permeable buffer layer.

Hereinafter, exemplary embodiments of the optical semiconductor apparatus of the present disclosure are described referring to drawings.

The optical semiconductor apparatus of the present disclosure may be a light-emitting LED apparatus and the optical semiconductor device may be, for example, an LED die emitting light in the ultraviolet range.

In the optical semiconductor apparatus of the present disclosure, the optical semiconductor device may specifically have an electrode installed on at least part of the light-emitting surface and a wire electrically connected to the electrode. For example, the optical semiconductor device may be an ultraviolet LED.

Figure 1:
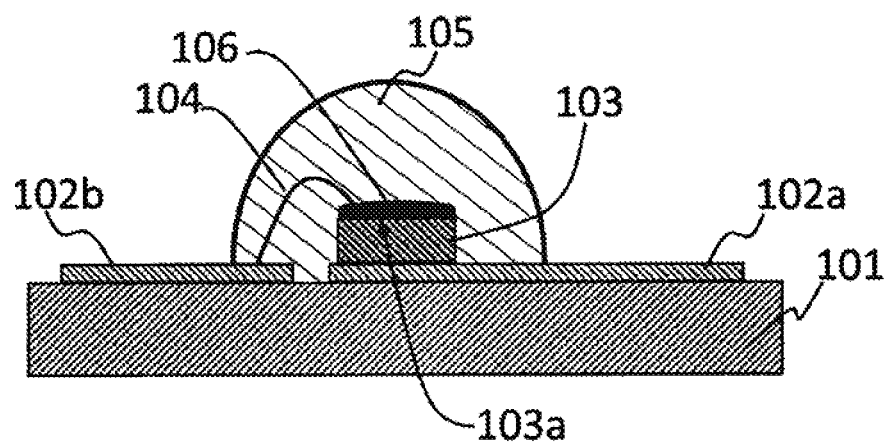
FIG. 1 is a schematic cross-sectional view of a surface-mount ultraviolet LED 100 constituting an optical semiconductor apparatus of the present disclosure.
Figure 2:
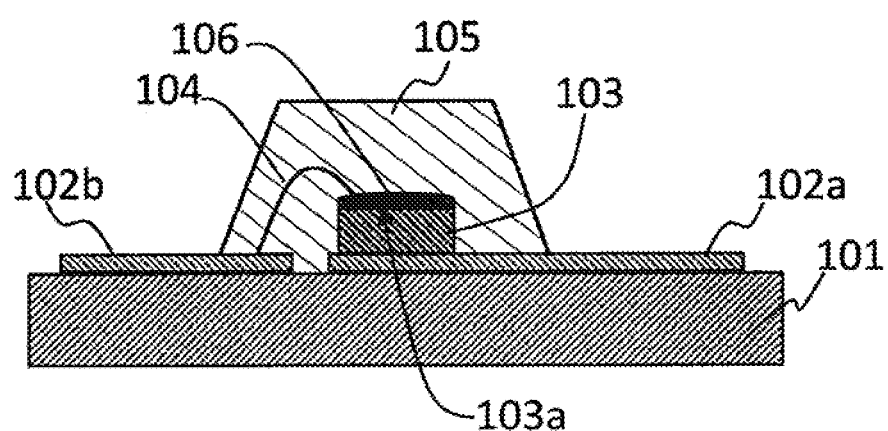
FIG. 2 is a schematic cross-sectional view of a surface-mount ultraviolet LED 100 constituting an optical semiconductor apparatus of the present disclosure.

FIG. 1 and FIG. 2 are schematic cross-sectional views of a surface-mount ultraviolet LED 100 constituting the optical semiconductor apparatus of the present disclosure.

As seen from FIG. 1 and FIG. 2, the ultraviolet LED 100 is equipped with a substrate 101, an LED die 103, etc. The substrate 101 is an insulating substrate (e.g., a ceramic (aluminum nitride, alumina, silicon nitride, silicon carbide, etc.)) or the so-called wiring substrate wherein an insulating layer is formed on a conducting metal substrate such as copper, etc. As seen from FIG. 1 and FIG. 2, an electrode pattern 102a and an electrode pattern 102b formed of a conducting metal material (e.g., copper, aluminum) are formed on the surface of the substrate 101.

The LED die 103 is usually in the form of a rectangular plate and is equipped with a cathode terminal (not shown) on an upper surface (i.e., a light-emitting surface 103a) and an anode terminal (not shown) on a lower surface. The lower surface (i.e., the anode terminal) of the LED die 103 and the electrode (positive electrode) pattern 102a are connected mechanically and electrically by a die bond (not shown). And, the cathode terminal on the upper surface of the LED die 103 is electrically connected to the electrode (negative electrode) pattern 102b through a bonding wire 104. When an electric current is applied between the anode terminal and the cathode terminal through the electrode (positive electrode) pattern 102a and the electrode (negative electrode) pattern 102b, ultraviolet light (e.g., light with a wavelength of 365 nm) is generated in a light-emitting layer (not shown) inside the LED die 103 and is emitted from the light-emitting surface 103a.

Alternatively, the LED die 103 may be equipped with the anode terminal (not shown) on the upper surface (i.e., the light-emitting surface 103a) and the cathode terminal (not shown) on the lower surface. In this case, the cathode terminal on the lower surface of the LED die 103 and the electrode (positive electrode) pattern 102a are connected mechanically and electrically by a die bond (not shown) and the anode terminal on the upper surface of the LED die 103 is electrically connected to the electrode (positive electrode) pattern 102b through a bonding wire 104. When an electric current is applied between the anode terminal and the cathode terminal, ultraviolet light is generated in a light-emitting layer (not shown) inside the LED die 103 and is emitted from the light-emitting surface 103a.

On the light-emitting surface 103a of the LED die 103 of the optical semiconductor device, a light-permeable buffer layer 106 containing a cured high-hardness silicone resin, which covers the light-emitting surface, is provided and a flexible sealing layer 105 containing a cured flexible silicone resin having a lower hardness than the light-permeable buffer layer, which covers the optical semiconductor device 103 and the light-permeable buffer layer 106, is provided to seal the optical semiconductor device (LED die) 103.

Specifically, as shown in FIG. 1 and FIG. 2, the optical semiconductor apparatus of the present disclosure may have an electrode installed on at least part of the light-emitting surface and a wire electrically connected to the electrode.

As described above, when a cured high-hardness silicone resin is used as a sealer for preventing deterioration of a UV-curable resin or a UV-curable ink by the strong UV light emitted from the ultraviolet LED, the wire may be broken easily. However, according to the present disclosure, by providing the light-permeable buffer layer containing the cured high-hardness silicone resin on the optical semiconductor device with a specific thickness, stress occurring in the wire due to the cured high-hardness silicone resin can be reduced by minimizing the contact area with the wire. In addition, because the heat resistance and UV resistance of the flexible sealing layer provided on the light-permeable buffer layer can be improved, the desired heat resistance and UV resistance can be achieved while preventing the breakage of the wire.

Specifically, in the optical semiconductor apparatus of the present disclosure, the flexible sealing layer may have a shape of an optical device. For example, the flexible sealing layer 105 may have a shape of a, e.g., semispherical, lens, as shown in FIG. 1.

When the flexible sealing layer has a shape of an optical device, the emitted light can be controlled without having to providing an additional optical device, which is advantageous in terms of product cost reduction and miniaturization of the light source.

Also, in the optical semiconductor apparatus of the present disclosure, the flexible sealing layer may have a shape other than that of a lens. For example, the flexible sealing layer 105 may have a truncated conical shape, as shown in FIG. 2.

Specifically, the optical semiconductor device of the present disclosure may emit ultraviolet light with a peak emission wavelength shorter than 395 nm. More specifically, it may emit ultraviolet light with a peak emission wavelength of 385 nm or shorter or ultraviolet light with a peak emission wavelength of 365 nm or shorter.

In the optical semiconductor device of the present disclosure, the lower limit of the peak emission wavelength is not particularly limited. Usually, it emits ultraviolet light with a wavelength of 200 nm or longer.

Because the ultraviolet light with a peak emission wavelength shorter than 395 nm has high light energy, if a highly flexible resin such as an epoxy resin is used as a sealer of the optical semiconductor device, the resin itself may be easily deteriorated by the strong UV light emitted from the optical semiconductor apparatus, resulting in coloration or cracking and thus decreased light emission. However, according to the present disclosure, because the light-permeable buffer layer containing the cured high-hardness silicone resin is provided on the light-emitting surface of the optical semiconductor device and then the optical semiconductor device is sealed with the flexible sealing layer containing the cured flexible silicone resin having a lower hardness than the cured high-hardness silicone resin, superior heat resistance, UV resistance and durability may be exerted easily.

In the optical semiconductor apparatus of the present disclosure, the flexible sealing layer may have an IRHD hardness of specifically 20 or lower, more specifically 10 or lower, further more specifically 7.5 or lower, even more specifically 5.0 or lower.

In the optical semiconductor apparatus of the present disclosure, the occurrence of cracking, etc. in the sealing layer may be prevented easily when the flexible sealing layer covering the optical semiconductor device has the above-described IRHD hardness.

In the optical semiconductor apparatus of the present disclosure, the light-permeable buffer layer may have an IRHD hardness of specifically 60 or higher, more specifically 70 or higher, further more specifically 80 or higher.

In the optical semiconductor apparatus of the present disclosure, superior heat resistance and UV resistance as well as superior durability may be exerted easily when the light-permeable buffer layer covering the outer surface of the optical semiconductor device has the above-described IRHD hardness.

In the optical semiconductor apparatus of the present disclosure, the hardness of the flexible sealing layer is lower than the hardness of the light-permeable buffer layer (the hardness of the light-permeable buffer layer is higher than the hardness of the flexible sealing layer). The IRHD hardness of the flexible sealing layer may be lower than the IRHD hardness of the light-permeable buffer layer by specifically 50.0-99.0, more specifically 60.0-95.0.

In the optical semiconductor apparatus of the present disclosure, the ratio of the IRHD hardness of the light-permeable buffer layer to the IRHD hardness of the flexible sealing layer may be specifically 6 or greater, more specifically 10 or greater, further more specifically 15 or greater.

In the optical semiconductor apparatus of the present disclosure, the occurrence of cracking in the flexible sealing layer may be prevented easily and superior durability, heat resistance and UV resistance may be exerted easily when the ratio of the IRHD hardness of the light-permeable buffer layer to the IRHD hardness of the flexible sealing layer satisfies the above-described condition.

The IRHD hardness is also called the international rubber hardness degree. In the present disclosure, it refers to the value measured according to JIS K6253.

In the optical semiconductor apparatus of the present disclosure, the light-permeable buffer layer may have a thickness of specifically 1-300 μm, more specifically 5-250 μm, further more specifically 10-200 μm.

According to the present disclosure, by providing the light-permeable buffer layer containing the cured high-hardness silicone resin on the optical semiconductor device with a specific thickness, stress occurring in the wire due to the cured high-hardness silicone resin can be reduced by minimizing the contact area with the wire while exerting heat resistance and UV resistance. Therefore, the breakage of the wire electrically connected to the optical semiconductor device can be significantly prevented while exerting superior heat resistance and UV resistance.

In the optical semiconductor apparatus of the present disclosure, the light-permeable buffer layer covers at least part of the light-emitting surface of the optical semiconductor device. The covered area is not particularly limited. For example, it may be 60% or greater and 100% or smaller, specifically 80% or greater and 100% or smaller, of the surface area of the light-emitting surface. In particular, 100% of the surface area of the light-emitting surface may be covered by the light-permeable buffer layer 106 containing the cured high-hardness silicone resin, as shown in FIG. 1.

Also, in the optical semiconductor apparatus of the present disclosure, the light-permeable buffer layer may also cover an additional surface other than the light-emitting surface of the optical semiconductor device (e.g., the side surface of the LED die 103 shown in FIG. 1).

In the optical semiconductor apparatus of the present disclosure, the flexible sealing layer contains the cured flexible silicone resin and the light-permeable buffer layer contains the cured high-hardness silicone resin.

In the optical semiconductor apparatus of the present disclosure, the cured flexible silicone resin or the cured high-hardness silicone resin is not specially limited as long as the desired performance can be exerted. Specifically, the cured flexible silicone resin or the cured high-hardness silicone resin may be a cured alkoxy oligomer having an organopolysiloxane structure which is liquid at room temperature, wherein the alkoxy oligomer has one or more structural unit selected from a structural unit represented by the general formula (1)

$(R^1R^2R^3SiO_{1/2})$     (1)

(wherein each of $R^1$, $R^2$ and $R^3$ is the same or different organic group), a structural unit represented by the general formula (2)

$(R^4R^5SiO_{2/2})$     (2)

(wherein each of $R^4$ and $R^5$ is the same or different organic group), a structural unit represented by the general formula (3)

$(R^6SiO_{3/2})$     (3)

(wherein $R^6$ is an organic group) and a structural unit represented by the general formula (4)

$(SiO_{4/2})$     (4)

as an essential constituent, and has one or more structural unit selected from a structural unit represented by the general formula (5)

$(R^7_a(OR^8)_{3-a}SiO_{1/2})$     (5)

(wherein a is 0, 1 or 2 and each of $R^7$ and $R^8$ is the same or different organic group, with the proviso that, if $R^7$ or $R^8$ is plural, the respective $R^7$ or $R^8$ may be identical to or different from each other), a structural unit represented by the general formula (6)

$(R^9_b(OR^{10})_{2-b}SiO_{2/2})$     (6)

(wherein b is 0 or 1 and each of $R^9$ and $R^{10}$ is the same or different organic group, with the proviso that, if $R^{10}$ is plural, the respective $R^{10}$ may be identical to or different from each other) and a structural unit represented by the general formula (7)

$((OR^{11})SiO_{3/2})$     (7)

(wherein $R^{11}$ is an organic group)

as an optional constituent.

The structural unit represented by the general formula (1), i.e., the structural unit represented by $(R^1R^2R^3SiO_{1/2})$, is a monofunctional structural unit (M unit), the structural unit represented by the general formula (2), i.e., the structural unit represented by $(R^4R^5SiO_{2/2})$, is a difunctional structural unit (D unit), the structural unit represented by the general formula (3), i.e., the structural unit represented by $(R^6SiO_{3/2})$, is a trifunctional structural unit (T unit), and the structural unit represented by the general formula (4), i.e., the structural unit represented by $(SiO_{4/2})$, is a quadrafunctional structural unit (Q unit).

And, the structural unit represented by the general formula (5), i.e., the structural unit represented by $(R^7_a(OR^8)_{3-a}SiO_{1/2})$, wherein a is 0, 1 or 2, is a difunctional structural unit having one alkoxy group $OR^8$, which is represented by $(R^7_2(OR^8)SiO_{1/2})$, if a is 2. If a is 1, it is a trifunctional structural unit having two alkoxy groups $OR^8$, which is represented by $(R^7(OR^8)_2SiO_{1/2})$. If a is 0, it is a quadrafunctional structural unit having three alkoxy groups $OR^8$, which is represented by $((OR^8)_3SiO_{1/2})$.

The structural unit represented by the general formula (6), i.e., the structural unit represented by $(R^9_b(OR^{10})_{2-b}SiO_{2/2})$, wherein b is 0 or 1, is a trifunctional structural unit having one alkoxy group $OR^{10}$, which is represented by $(R^9(OR^{10})SiO_{2/2})$, if b is 1. If b is 0, it is a quadrafunctional structural unit having two alkoxy groups $OR^{10}$, which is represented by $((OR^{10})_2SiO_{2/2})$.

The structural unit represented by the general formula (7), i.e., the structural unit represented by $((OR^{11})SiO_{3/2})$, is a quadrafunctional structural unit having one alkoxy group $OR^{11}$.

In the general formula (1), each of $R^1$, $R^2$ and $R^3$ is the same or different organic group. In the general formula (2), each of $R^4$ and $R^5$ is the same or different organic group. In the general formula (3), $R^6$ is an organic group.

In the general formula (5), each of $R^7$ and $R^8$ is the same or different organic group, with the proviso that, if $R^7$ or $R^8$ is plural, the respective $R^7$ or $R^8$ may be identical to or different from each other.

In the general formula (6), each of $R^9$ and $R^{10}$ is the same or different organic group, with the proviso that, if $R^{10}$ is plural, the respective $R^{10}$ may be identical to or different from each other.

In the general formula (7), $R^{11}$ is an organic group.

As described above, each of the organic groups $R^1$, $R^2$, $R^3$, $R^4$, $R^5$, $R^6$, $R^7$, $R^8$, $R^9$, $R^{10}$ and $R^{11}$ ($R^1$ through $R^{11}$) is the same or different organic group.

One or more organic group selected from $R^1$ through $R^{11}$ may be specifically a hydrocarbon group, specifically a $C_1$-$C_{12}$ hydrocarbon group, further more specifically a $C_1$-$C_8$ hydrocarbon group, even more specifically a $C_1$-$C_4$ hydrocarbon group, even more specifically a $C_1$-$C_3$ hydrocarbon group, particularly specifically a $C_1$-$C_2$ hydrocarbon group.

The hydrocarbon group may be an alkyl group.

When the hydrocarbon group is an alkyl group, the alkyl group may be one or more selected from a group consisting of a methyl group, an ethyl group, a propyl group, a butyl group, a pentyl group, a hexyl group, a heptyl group, an octyl group, a nonyl group, a decyl group, an undecyl group, a dodecyl group, etc. It may be specifically a methyl group or an ethyl group, more specifically a methyl group.

In the optical semiconductor apparatus of the present disclosure, one or more organic group selected from $R^1$ through $R^{11}$ ($R^1$, $R^2$, $R^3$, $R^4$, $R^5$, $R^6$, $R^7$, $R^8$, $R^9$, $R^{10}$ and $R^{11}$) may be specifically a methyl group.

That is to say, in the optical semiconductor apparatus of the present disclosure, at least one of the organic group contained in the structural unit constituting the alkoxy oligomer having an organopolysiloxane structure, which forms the cured flexible silicone resin or the cured high-hardness silicone resin, may be specifically a methyl group. More specifically, all the organic groups contained in the structural unit constituting the alkoxy oligomer may be methyl groups.

When the one or more organic group selected from $R^1$ through $R^{11}$ is a methyl group, the desired UV resistance can be exerted easily.

The binding energy of the Si—O bond (siloxane bond) constituting the main chain of silicone is about 799.6±13.4 kJ/mol, which is larger than the binding energy of the C—C constituting the main chain of s an organic group (607±21 kJ/mol). Therefore, silicone will exhibit superior heat resistance and UV resistance.

C atom has an electronegativity of 2.55, Si atom has an electronegativity of 1.90 and O atom has an electronegativity of 3.44. Because the difference in electronegativity of Si atom and O atom constituting the main chain of silicone is as large as 1.54, the relevant bond is highly ionic. Meanwhile, the difference in electronegativity of C atom and C atom constituting the main chain of a general organic resin such as polyethylene, etc. is 0. Due to this difference in electronegativity, the electron of the Si atom constituting the silicone main chain is attracted by the O atom and the Si atom makes attracts an electron from a side chain to compensate for it. As a result, the electron is introduced from the side chain to the Si atom, thereby enhancing the bonding of the C—H bond, C—C bond, etc. constituting the side chain and the bonding between the side chain and the main chain. It is thought that heat resistance and UV resistance are improved through this.

As the side chain having the C—H bond, C—C bond, etc. increases in size and thus the distance between the atom constituting the side chain and the Si atom constituting the main chain is increased, the contribution to stability by the ionic Si—O bond is decreased. Therefore, in terms of improvement of heat resistance and UV resistance, it is preferred that the organic group (i.e., the organic group represented by $R^1$ through $R^{11}$) of the side chain has fewer carbon atoms. Particularly, the methyl group is the most preferred in that it is the smallest alkyl group, the distance from all the atoms constituting the methyl group to the Si atom (to which the methyl group is bonded) is short, stabilization through ionic bonding is easy and there is no C—C bond.

Also, specifically, the organic group represented by $R^1$ through $R^{11}$ may be one not containing an aromatic ring.

When a group having an aromatic ring such as, e.g., a phenyl group is used as the organic group represented by $R^1$ through $R^{11}$, light transmittance in the UV range and UV resistance may decrease easily because light absorption occurs from the ultraviolet to the visible range due to the π-π* transition caused by the π electrons of the functional group. For this reason, it is preferred that the organic group represented by $R^1$ through $R^{11}$ is a group not containing an aromatic ring such as a benzene-based aromatic ring, a conjugated aromatic ring, a non-benzene-based aromatic ring, etc.

Also, specifically, the organic group represented by $R^1$ through $R^{11}$ may be one not containing a N atom-containing group (amino group, etc.) or a S atom-containing group (mercapto group, etc.) to prevent deterioration of UV resistance. And, for the same reason, when the organic group represented by $R^1$ through $R^{11}$ is a hydrocarbon which is not an aromatic hydrocarbon, it is preferred that a group containing a carbon-carbon bond (C—C bond, C=C bond or C≡C bond) does not contain the N atom-containing group or S atom-containing group if possible.

As described above, in the optical semiconductor apparatus of the present disclosure, the alkoxy oligomer having an organopolysiloxane structure which forms the cured flexible silicone resin or the cured high-hardness silicone resin may contain, as the optional structural unit having an alkoxy group, one or more structural unit selected from a group consisting of the structural unit represented by the general formula (5), i.e., the structural unit represented by ($R^7_a(OR^8)_{3-a}SiO_{1/2}$), the structural unit represented by the general formula (6), i.e., the structural unit represented by ($R^9_b(OR^{10})_{2-b}SiO_{2/2}$), and the structural unit represented by the general formula (7), i.e., the structural unit represented by (($OR^{11})SiO_{3/2}$).

In the optical semiconductor apparatus of the present disclosure, as the alkoxy oligomer having an organopolysiloxane structure, which forms the cured flexible silicone resin or the cured high-hardness silicone resin, contains the structural unit having an alkoxy group selected from the general formulas (5) to (7), the optical semiconductor device and the light-permeable buffer layer are chemically bonded strongly and, also, the light-permeable buffer layer and the flexible sealing layer are chemically bonded strongly.

In general, a protective layer formed of $SiO_2$, etc. is provided on the light-emitting surface of the optical semiconductor device such as the LED die, which is formed of an inorganic material, and a hydroxyl group is present there. Due to the hydrogen bonding or intermolecular van der Waals force between the alkoxy group of the structural unit having an alkoxy group selected from the general formulas (5) to (7) of the alkoxy oligomer having an organopolysiloxane structure, which forms the cured high-hardness silicone resin, or a hydroxyl group formed as the alkoxy group reacts with water in the atmosphere and the hydroxyl group on the die surface, bonding is formed between the alkoxy group or hydroxyl group and the hydroxyl group on the die surface through dealcoholization condensation or dehydration condensation, resulting in strong chemical bonding between the optical semiconductor device and the light-permeable buffer layer.

In addition, both the cured flexible silicone resin and the cured high-hardness silicone resin constituting the flexible sealing layer have a siloxane surface on the surface and the alkoxy group or a hydroxyl group formed as the alkoxy group reacts with water in the atmosphere is present there. Therefore, the light-permeable buffer layer and the flexible sealing layer are chemically bonded strongly due to the strong hydrogen bonding or intermolecular van der Waals force between them or as bonding is formed between the alkoxy group or hydroxyl group and the hydroxyl group on the surface of the flexible sealing layer through dealcoholization condensation or dehydration condensation.

As such, in the optical semiconductor apparatus of the present disclosure, as the alkoxy oligomer having an organopolysiloxane structure, which forms the cured flexible silicone resin or the cured high-hardness silicone resin, contains the structural unit having an alkoxy group represented by the general formulas (5) to (7), the optical semiconductor device and the light-permeable buffer layer are chemically bonded strongly and the light-permeable buffer layer and the flexible sealing layer are chemically bonded strongly. Therefore, the occurrence of peeling, etc. may be prevented easily.

In the optical semiconductor apparatus of the present disclosure, the alkoxy oligomer having an organopolysiloxane structure, which forms the cured flexible silicone resin or the cured high-hardness silicone resin, may contain 90-100 mol %, more specifically 95-100 mol %, further more specifically 100 mol %, of the structural unit represented by the general formulas (1) to (7) based on 100 mol % of the total siloxane units constituting the alkoxy oligomer.

That is to say, in the optical semiconductor apparatus of the present disclosure, the alkoxy oligomer having an organopolysiloxane structure, which forms the cured flexible silicone resin or the cured high-hardness silicone resin, the sum of the mol % of the structural unit represented by the general formula (1), the mol % of the structural unit represented by the general formula (2), the mol % of the structural unit represented by the general formula (3), the mol % of the structural unit represented by the general formula (4), the mol % of the structural unit represented by the general formula (5), the mol % of the structural unit represented by the general formula (6) and the mol % of the structural unit represented by the general formula (7) may be specifically 90-100 mol %, more specifically 95-100 mol %, further more specifically 100 mol % (all the siloxane units constituting the silicone resin consist of one or more structural unit represented by the general formulas (1) to (7)), based on 100 mol % of the total siloxane units constituting the alkoxy oligomer.

In the alkoxy oligomer having an organopolysiloxane structure, which forms the cured flexible silicone resin or the cured high-hardness silicone resin, the constitutional ratio of the structural units represented by the general formulas (1) to (7) is not specially limited as long as the desired hardness can be exerted.

Specifically, the alkoxy oligomer forming the cured high-hardness silicone resin may contain 0-5 mol % of the structural unit represented by the general formula (1) based on 100 mol % of the total siloxane units constituting the alkoxy oligomer.

Specifically, the alkoxy oligomer forming the cured high-hardness silicone resin may contain 0-70 mol % of the structural unit represented by the general formula (2) based on 100 mol % of the total siloxane units constituting the alkoxy oligomer.

Specifically, the alkoxy oligomer forming the cured high-hardness silicone resin may contain 30-100 mol % of the structural unit represented by the general formula (3) based on 100 mol % of the total siloxane units constituting the alkoxy oligomer.

Specifically, the alkoxy oligomer forming the cured high-hardness silicone resin may contain 30-70 mol % of the structural unit represented by the general formula (4) based on 100 mol % of the total siloxane units constituting the alkoxy oligomer.

The alkoxy oligomer forming the cured flexible silicone resin may contain specifically 0-5.0 mol %, more specifically 0-3.5 mol %, further more specifically 0-2.5 mol %, of the structural unit represented by the general formula (1) based on 100 mol % of the total siloxane units constituting the alkoxy oligomer.

The alkoxy oligomer forming the cured flexible silicone resin may contain specifically 75.0-99.9 mol %, more specifically 85-99.5 mol %, further more specifically 90.0-99.0 mol %, of the structural unit represented by the general formula (2) based on 100 mol % of the total siloxane units constituting the alkoxy oligomer.

The alkoxy oligomer forming the cured flexible silicone resin may contain specifically 0.1-25.0 mol %, more specifically 0.5-15.0 mol %, further more specifically 1.0-10.0 mol %, of the structural unit represented by the general formula (3) based on 100 mol % of the total siloxane units constituting the alkoxy oligomer.

The alkoxy oligomer forming the cured flexible silicone resin may contain specifically 0-5.0 mol %, more specifically 0-3.5 mol %, further more specifically 0-2.5 mol %, of the structural unit represented by the general formula (4) based on 100 mol % of the total siloxane units constituting the alkoxy oligomer.

In the optical semiconductor apparatus according to the present disclosure, the molar ratio A of the structural unit represented by the general formula (3) (T unit) to the structural unit represented by the general formula (2) (D unit) (the mole of the structural unit represented by the general formula (2) (D unit)/the mole of the structural unit represented by the general formula (3) (T unit)) in the structural units of the alkoxy oligomer forming the cured high-hardness silicone resin may be specifically 2.5 or smaller, more specifically 1.5 or smaller, further more specifically 1.0 or smaller.

In the structural units of the alkoxy oligomer forming the cured high-hardness silicone resin, i.e., the structural unit represented by the general formula (1) (M unit), the structural unit represented by the general formula (2) (D unit), the structural unit represented by the general formula (3) (T unit) and the structural unit represented by the general formula (4) (Q unit), thermal deterioration is decreased as the number of organic groups bonded to the Si atom is smaller and the ionic bonding nature due to the difference in electronegativity is increased as the number of oxygen atoms bonded to the Si atom is larger. Accordingly, the contribution to the durability (heat resistance and UV resistance) of the alkoxy oligomer is the lowest for the structural unit represented by the general formula (1) (M unit) and increases in the order of the structural unit represented by the general formula (2) (D unit), the structural unit represented by the general formula (3) (T unit) and the structural unit represented by the general formula (4) (Q unit).

If the proportion of the structural unit represented by the general formula (4) (Q unit) is excessively high, the ability of reducing stress is decreased as a rigid 3-dimensional crosslinked structure is formed, resulting in decreased impact resistance. And, if the proportion of the structural unit represented by the general formula (1) (M unit) is excessively high, heat resistance and light resistance are unsatisfactory. Therefore, it is preferred that the structural units of the alkoxy oligomer forming the cured high-hardness silicone resin have a high content of the structural unit represented by the general formula (3) (T unit).

In the optical semiconductor apparatus according to the present disclosure, the molar ratio B of the structural unit represented by the general formula (3) (T unit) to the structural unit represented by the general formula (2) (D unit) (the mole of the structural unit represented by the general formula (2) (D unit)/the mole of the structural unit represented by the general formula (3) (T unit)) in the structural units of the alkoxy oligomer forming the cured flexible silicone resin may be specifically 30 or larger, more specifically 25 or larger, further more specifically 20 or larger.

In the structural units of the alkoxy oligomer forming the cured flexible silicone resin, i.e., the structural unit represented by the general formula (1) (M unit), the structural unit represented by the general formula (2) (D unit), the structural unit represented by the general formula (3) (T unit) and the structural unit represented by the general formula (4) (Q unit), flexibility can be exerted as the number of organic groups bonded to the Si atom is larger. Accordingly, it is preferred that the structural units of the alkoxy oligomer forming the cured flexible silicone resin has a higher content of the structural unit represented by the general formula (2) (D unit) than the structural unit represented by the general formula (3) (T unit). However, if the proportion of the structural unit represented by the general formula (4) (Q unit) is excessively high, the ability of reducing stress is decreased as a rigid 3-dimensional crosslinked structure is formed, resulting in decreased impact resistance. And, if the proportion of the structural unit represented by the general formula (1) (M unit) is excessively high, heat resistance and light resistance may be unsatisfactory.

In the optical semiconductor apparatus according to the present disclosure, the ratio of the molar ratio A to the molar ratio B may be specifically 0.13 or smaller, more specifically 0.1 or smaller, further more specifically 0.075 or smaller.

The optical semiconductor apparatus according to the present disclosure, wherein the molar ratio A to the molar ratio B is 0.13 or smaller, may easily exert superior durability as the light-permeable buffer layer exhibits the desired heat resistance and UV resistance and may easily prevent the occurrence of cracking, etc. as the flexible sealing layer exhibits the desired flexibility.

In the structural unit represented by the general formula (5) ($R^7_a(OR^8)_{3-a}SiO_{1/2}$), the structural unit wherein a is 2 ($R^7_2(OR^8)SiO_{1/2}$) is obtained during the preparation of the alkoxy oligomer as some of the source of the structural unit represented by the general formula (2) ($R^4R^5SiO_{2/2}$) remains unreacted.

And, the structural unit wherein a is 1 ($R^7(OR^8)_2SiO_{1/2}$) in the structural unit represented by the general formula (5) ($R^7_a(OR^8)_{3-a}SiO_{1/2}$) or the structural unit wherein b is 1 ($R^9(OR^{10})SiO_{2/2}$) in the structural unit represented by the general formula (6) ($R^9_b(OR^{10})_{2-b}SiO_{2/2}$) is obtained during the preparation of the alkoxy oligomer as some of the source of the structural unit represented by the general formula (8) ($R^6SiO_{3/2}$) remains unreacted In the optical semiconductor apparatus of the present disclosure, the amount of the alkoxy group contained in the alkoxy oligomer having an organopolysiloxane structure, which forms the cured flexible silicone resin or the cured high-hardness silicone resin, may be specifically 10-30 mass %, more specifically 11-27.5 mass %, further more specifically 12-25 mass %.

When the amount of the alkoxy group contained in the alkoxy oligomer forming the cured flexible silicone resin or the cured high-hardness silicone resin is within the above-described range, the desired ability of reducing stress may be exerted because the 3-dimensional binding is prevented while maintaining the desired solid content.

In the optical semiconductor apparatus of the present disclosure, the mass-average molecular weight of the alkoxy oligomer having an organopolysiloxane structure, which forms the cured flexible silicone resin or the cured high-hardness silicone resin, is not particularly limited.

In the optical semiconductor apparatus of the present disclosure, the alkoxy oligomer forming the cured flexible silicone resin or the cured high-hardness silicone resin has an organopolysiloxane structure which is liquid at room temperature (25° C.).

In the optical semiconductor apparatus of the present disclosure, because the alkoxy oligomer having an organopolysiloxane structure, is liquid at room temperature (25° C.), the light-permeable buffer layer can be formed easily, for example, by applying the oligomer on the optical semiconductor device and then curing the same or the flexible sealing layer having the desired shape can be formed easily by filling the oligomer in a mold then curing the same.

In the present disclosure, being liquid at room temperature means that the viscosity measured at room temperature according to JIS Z 8803 is 103 Pa-s or lower.

In the optical semiconductor apparatus of the present disclosure, a method for preparing the alkoxy oligomer forming the cured flexible silicone resin or the cured high-hardness silicone resin is not particularly limited.

For example, in the optical semiconductor apparatus of the present disclosure, the alkoxy oligomer forming the cured flexible silicone resin or the cured high-hardness silicone resin may be prepared by mixing one or more selected from the organosiloxanes represented by the general formulas (1)' to (4)' corresponding to the general formulas (1) to (4) and hydrolyzing and condensing the same.

$R^{12}R^{13}R^{14}SiOR^{15}$ (1)'

(wherein each of $R^{12}$, $R^{13}$, $R^{14}$ and $R^{15}$ is the same or different organic group)

$R^{16}R^{17}Si(OR^{18})(OR^{19})$ (2)'

(wherein each of $R^{16}$, $R^{17}$, $R^{18}$ and $R^{19}$ is the same or different organic group)

$R^{20}Si(OR^{21})(OR^{22})(OR^{23})$ (3)'

(wherein each of $R^{20}$, $R^{21}$, $R^{22}$ and $R^{23}$ is the same or different organic group)

$Si(OR^{24})(OR^{25})(OR^{26})(OR^{27})$ (4)'

(wherein each of $R^{24}$, $R^{25}$, $R^{26}$ and $R^{27}$ is the same or different organic group)

The organic group represented by $R^{12}$ through $R^{27}$ may be the same group as the organic group represented by $R^1$ through $R^{11}$.

During the hydrolysis and condensation, if a predetermined amount of the alkoxy group is left without completely conducting the hydrolysis, i.e., if some of the alkoxy group constituting the organosiloxane represented by the general formulas (2) to (4)' (—$OR^{18}$, —$OR^{19}$, —$OR^{21}$, —$OR^{22}$, —$OR^{23}$, —$OR^{24}$, —$OR^{25}$, —$OR^{26}$, —$OR^{27}$) is left, one or more siloxane unit represented by the general formulas (5) to (7) may be formed.

The remaining amount of the alkoxy group may be controlled by adequately controlling the condition of the hydrolysis and condensation (catalyst, reaction time, reaction temperature, etc.).

The mixing ratio of the organosiloxanes represented by the general formulas (1)' to (4)' may be determined adequately depending on the desired alkoxy oligomer.

Specifically, in the optical semiconductor apparatus of the present disclosure, the alkoxy oligomer having an organopolysiloxane structure, which forms the cured flexible silicone resin or the cured high-hardness silicone resin, may be prepared, for example, by hydrolyzing methyltrimethoxysilane (rational formula: $CH_3Si(OCH_3)_3$, hereinafter abbreviated as MTMS) or a mixture of MTMS and dimethyldimethoxysilane (rational formula: $(CH_3)_2Si(OCH_3)_2$, hereinafter abbreviated as DMDMS) in the presence of a catalyst and water.

Also, in the optical semiconductor apparatus of the present disclosure, the alkoxy oligomer forming the cured flexible silicone resin or the cured high-hardness silicone resin may be a silicone alkoxy oligomer prepared by a different method.

For example, the alkoxy oligomer having an organopolysiloxane structure may be Shin-Etsu Chemical's silicone alkoxy oligomer X-40-9225, X-40-9246, X-40-9250, KC-89S or KR-500 or Momentive Performance Materials Japan's XC-96-B0446, XR31-B1410, XR31-B2230, etc.

In the optical semiconductor apparatus of the present disclosure, when the alkoxy oligomer having an organopolysiloxane structure, which forms the cured flexible silicone resin or the cured high-hardness silicone resin, is prepared by hydrolyzing and condensing one or more selected from the organosiloxanes represented by the general formulas (1)' to (4)', the reaction may be conducted in the presence of a catalyst at temperatures of about 0-100° C. for about tens of minutes to 1 day.

As the catalyst used for the hydrolysis and condensation of the organosiloxanes represented by the general formulas (1)' to (4)', an inorganic acid such as hydrochloric acid, nitric acid, sulfuric acid, perchloric acid, phosphoric acid, etc. or an organic acid such as formic acid, acetic acid, etc. may be used. If necessary, an organic solvent may be added for co-hydrolysis and condensation.

In this case, an alcohol such as methanol, ethanol, 1-propanol, 2-propanol, etc., an aromatic compound such as toluene, xylene, etc., a ketone such as acetone, etc., or an ester such as ethyl acetate, etc. may be used as the solvent.

As a catalyst curing the alkoxy oligomer obtained from the hydrolysis and condensation of the one or more selected from the organosiloxanes represented by the general formulas (1)' to (4)', a silicone-curing catalyst may be used. The silicone-curing catalyst may be a metal (e.g., Ti, Zr, Al, etc.) alkoxide, a metal (e.g., Ti, Zr, Al, etc.) chelate, a metal (e.g., Zr, Zn, etc.) naphthenate, a metal (e.g., Zr, Zn, etc.) octoate, dibutyltin diacetate, dibutyltin laurate, an amine such as monoethanolamine, diethanolamine, triethanolamine, etc. or phosphoric acid.

Specifically, in the organosiloxanes represented by the general formulas (1)' to (4)', the organic group represented by $R^{12}$-$R^{27}$ may be one not containing an aromatic ring.

As described above, when a group having an aromatic ring such as, e.g., a phenyl group is used as the organic group represented by $R^{12}$ through $R^{27}$, light transmittance in the UV range and UV resistance may decrease easily because light absorption occurs from the ultraviolet to the visible range due to the π-π transition caused by the π electrons of the functional group. For this reason, it is preferred that the organic group represented by $R^{12}$ through $R^{27}$ is a group not containing an aromatic ring such as a benzene-based aromatic ring, a conjugated aromatic ring, a non-benzene-based aromatic ring, etc.

Also, specifically, the organic group represented by $R^{12}$ through $R^{27}$ may be one not containing a N atom-containing group (amino group, etc.) or a S atom-containing group (mercapto group, etc.) to prevent deterioration of UV resistance. And, for the same reason, when the organic group represented by $R^{12}$ through $R^{27}$ is a hydrocarbon which is not an aromatic hydrocarbon, it is preferred that a group containing a carbon-carbon bond (C—C bond, C═C bond or C≡C bond) does not contain the N atom-containing group or S atom-containing group if possible.

Specifically, in the optical semiconductor apparatus of the present disclosure, the light-permeable buffer layer is formed of a cured product of a solution containing an alkoxy oligomer having an organopolysiloxane structure which forms the cured high-hardness silicone resin, wherein the solution containing the alkoxy oligomer does not show fluidity when provided for a curing test of (a) dropping 30 μL of the solution on a glass substrate,
(b) keeping the glass substrate at 150° C. for 1 hour, (c) cooling the heat-treated glass substrate to room temperature, and (d) vertically standing the glass substrate and keeping for 10 minutes.

The solution containing the alkoxy oligomer may contain specifically 20-85 mass %, more specifically 22.5-80 mass %, further more specifically 25-75 mass %, of the alkoxy oligomer having an organopolysiloxane structure based on the solid content (non-volatile content).

The optical semiconductor apparatus of the present disclosure may easily exert the desired strength when the light-permeable buffer layer is formed of a cured product of the solution containing the alkoxy oligomer which shows fluidity when provided for the curing test.

A method for preparing the optical semiconductor apparatus according to the present disclosure is not particularly limited.

For example, the ultraviolet LED 100 shown in FIG. 1 and FIG. 2 may be prepared by die-bonding the LED die 103 to the electrode (positive electrode or negative electrode) pattern 102a, wire-bonding the cathode terminal (or anode terminal) of the LED die 103 and the electrode (negative electrode or positive electrode) pattern 102b through a bonding wire 104, applying the solution containing the alkoxy oligomer having an organopolysiloxane structure, which forms the cured high-hardness silicone resin, so as to cover at least part of the light-emitting surface of the LED die 103, forming the light-permeable buffer layer 106 through curing by heating at 100-200° C. for about 1-2 hours, filling a solution containing the cured flexible silicone resin in a mold (not shown) and forming the flexible sealing layer 105 through curing by heating at 100-200° C. for about 1-2 hours.

The solution containing the alkoxy oligomer having an organopolysiloxane structure may be the same as described above.

And, the solution containing the cured flexible silicone resin may be the solution containing the alkoxy oligomer having an organopolysiloxane structure and may contain specifically 20-85 mass %, more specifically 22.5-80 mass %, further more specifically 25-75 mass %, of the alkoxy oligomer having an organopolysiloxane structure based on the solid content (non-volatile content).

According to the present disclosure, by providing the light-permeable buffer layer containing the cured high-hardness silicone resin on the optical semiconductor device with a specific thickness, stress occurring in the wire due to the cured high-hardness silicone resin can be reduced by minimizing the contact area with the wire while exerting heat resistance and UV resistance. Therefore, the breakage of the wire electrically connected to the optical semiconductor device can be significantly prevented while exerting superior heat resistance and UV resistance.

EXAMPLES

Hereinafter, the present disclosure will be described in detail through examples. However, the following examples are for illustrative purposes only and it will be apparent to those of ordinary skill in the art that the scope of the present disclosure is not limited by the examples.

(Preparation of Silicone Resin Compositions K0-K10)

An alkoxy oligomer a (number-average molecular weight 3,000, T unit:D unit (molar ratio)=0:100) having an organopolysiloxane structure, which is liquid at room temperature, and an alkoxy oligomer b (D unit:T unit (molar ratio)=46.4:53.6) which is liquid at room temperature were mixed in the presence of a curing catalyst while heating at 60° C. for 1 hour. After cooling to room temperature and further adding the alkoxy oligomer a so as to satisfy the weight ratio described in Table 1, colorless, transparent and homogeneous silicone resin compositions K0-K10 having the D unit and the T unit with the proportions described in Table 1 were obtained by stirring for 1 hour.

The curability and IRHD hardness of the obtained silicone resin compositions were evaluated by the methods described below. The result is given in Table 1.

(Curability)

30 μL of each silicone resin composition was dropped on a slide glass using a micropipette. The slide glass was kept at 150° C. for 1 hour and then cooled to room temperature. After vertically standing the slide glass and keeping for 10 minutes, the silicone resin composition was determined to be [cured] if no fluidity was shown.

(IRHD Hardness)

Each silicone resin composition was added to a PFA schale with an inner diameter of 50 mm and an inner height of 12 mm and a cured silicone resin with a thickness of about 2 mm was obtained through curing by keeping at 70° C. for 1 hour, keeping at 110° C. for 1 hour and then keeping at 150° C. for 1 hour.

The IRHD hardness of the obtained cured silicone resin was evaluated according to the IRHD-M method using the universal automatic rubber hardness tester Digitest II (M&K).

TABLE 1

|  | Alkoxy oligomer b (mass %) | Alkoxy oligomer a (mass %) | D unit (mol %) | T unit (mol %) | D unit/ T unit (mol %) | Curability | IRHD hardness |
|---|---|---|---|---|---|---|---|
| K0 | 100 | 0 | 46.4 | 53.6 | 0.87 | Cured | 90.2 |
| K1 | 90 | 10 | 52.3 | 47.7 | 1.10 | Cured | 71.5 |
| K2 | 80 | 20 | 58.1 | 41.9 | 1.38 | Cured | 67.6 |
| K3 | 70 | 30 | 63.7 | 36.3 | 1.76 | Cured | 61.7 |
| K4 | 60 | 40 | 69.2 | 30.8 | 2.25 | Cured | 63.1 |
| K5 | 50 | 50 | 74.6 | 25.4 | 2.94 | Cured | 53.3 |
| K6 | 40 | 60 | 79.9 | 20.1 | 3.98 | Cured | 50.4 |
| K7 | 30 | 70 | 85.1 | 14.9 | 5.71 | Cured | 40.8 |
| K8 | 20 | 80 | 90.2 | 9.8 | 9.17 | Cured | 28.3 |
| K9 | 10 | 90 | 95.1 | 4.1 | 19.5 | Cured | 7.3 |
| K10 | 5 | 95 | 97.6 | 2.4 | 40.3 | Cured | 4.2 |

(Preparation of Silicone Resin Compositions Y1-Y10)

Colorless, transparent and homogeneous silicone resin compositions Y1-Y10 having the D unit and the T unit with the proportions described in Table 2 were obtained in the same manner as the preparation of the silicone resin compositions K0-K10, except that an alkoxy oligomer c (number-average molecular weight 6,000, T unit:D unit (molar ratio)=0:100) having an organopolysiloxane structure, which is liquid at room temperature, was used instead of the alkoxy oligomer a (number-average molecular weight 3,000, T unit:D unit (molar ratio)=0:100) having an organopolysiloxane structure, which is liquid at room temperature, and the alkoxy oligomer c and the alkoxy oligomer b were mixed so as to satisfy the weight ratio described in Table 2.

The curability and IRHD hardness of the obtained silicone resin compositions were evaluated in the same manner as the evaluation for the silicone resin compositions K0-K10. The result is given in Table 2.

TABLE 2

|  | Alkoxy oligomer b (mass %) | Alkoxy oligomer c (mass %) | D unit (mol %) | T unit (mol %) | D unit/ T unit (mol %) | Curability | IRHD hardness |
|---|---|---|---|---|---|---|---|
| Y1 | 90 | 10 | 52.4 | 47.6 | 1.10 | Cured | 73.5 |
| Y2 | 80 | 20 | 58.2 | 41.8 | 1.39 | Cured | 65.5 |
| Y3 | 70 | 30 | 63.9 | 36.1 | 1.77 | Cured | 64.5 |
| Y4 | 60 | 40 | 69.4 | 30.6 | 2.27 | Cured | 60.7 |
| Y5 | 50 | 50 | 74.8 | 25.2 | 2.97 | Cured | 55.9 |
| Y6 | 40 | 60 | 80.1 | 19.9 | 4.02 | Cured | 49.9 |
| Y7 | 30 | 70 | 85.2 | 14.8 | 5.77 | Cured | 43.4 |
| Y8 | 20 | 80 | 90.3 | 9.7 | 9.27 | Cured | 25.5 |
| Y9 | 10 | 90 | 95.2 | 4.8 | 19.8 | Cured | 9.4 |
| Y10 | 5 | 95 | 97.6 | 2.4 | 40.8 | Cured | 3.1 |

(Preparation of Silicone Resin Compositions X1-X10)

Colorless, transparent and homogeneous silicone resin compositions X1-X10 having the D unit and the T unit with the proportions described in Table 3 were obtained in the same manner as the preparation of the silicone resin compositions K0-K10, except that an alkoxy oligomer d (number-average molecular weight 20,000, T unit:D unit (molar ratio)=0:100) having an organopolysiloxane structure, which is liquid at room temperature, was used instead of the alkoxy oligomer a (number-average molecular weight 3,000, T unit:D unit (molar ratio)=0:100) having an organopolysiloxane structure, which is liquid at room temperature, and the alkoxy oligomer d and the alkoxy oligomer b were mixed so as to satisfy the weight ratio described in Table 3.

The curability and IRHD hardness of the obtained silicone resin compositions were evaluated in the same manner as the evaluation for the silicone resin compositions K0-K10. The result is given in Table 3.

TABLE 3

|  | Alkoxy oligomer b (mass %) | Alkoxy oligomer d (mass %) | D unit (mol %) | T unit (mol %) | D unit/ T unit (mol %) | Curability | IRHD hardness |
|---|---|---|---|---|---|---|---|
| X1 | 90 | 10 | 52.3 | 47.7 | 1.10 | Cured | 72.2 |
| X2 | 80 | 20 | 58.1 | 41.9 | 1.39 | Cured | 67.3 |
| X3 | 70 | 30 | 63.8 | 36.2 | 1.76 | Cured | 62.6 |
| X4 | 60 | 40 | 69.3 | 30.7 | 2.26 | Cured | 62.7 |
| X5 | 50 | 50 | 74.7 | 25.3 | 2.96 | Cured | 55.2 |
| X6 | 40 | 60 | 80.0 | 20.0 | 4.01 | Cured | 50.4 |
| X7 | 30 | 70 | 85.2 | 14.8 | 5.75 | Cured | 42.4 |
| X8 | 20 | 80 | 90.2 | 9.8 | 9.24 | Cured | 27.6 |
| X9 | 10 | 90 | 95.2 | 4.8 | 19.7 | Cured | 9.7 |
| X10 | 5 | 95 | 97.6 | 2.4 | 40.7 | Cured | 3.5 |

(Preparation of Silicone Resin Composition A)
(Synthesis of Alkoxy Oligomer)

68.10 g (0.50 mol) of methyltrimethoxysilane (MTMS, rational formula $CH_3Si(OCH_3)_3$, molecular weight: 136.2) and 32.04 g (1.00 mol) of methanol (rational formula: $CH_3OH$) were added to a 500-mL four-neck flask equipped with a nitrogen introducing tube, a Liebig cooling tube and a cocked dropping funnel and mixed by stirring at room temperature. Hydrochloric acid (rational formula: HCl) was used as a hydrolysis catalyst for hydrolysis of the methoxy group of MTMS. After adding 13.52 g of 3.70 mol/L hydrochloric acid solution dropwise for 30 minutes to satisfy the molar ratios HCl/MTMS=0.1 and $H_2O$/MTMS=1.5, the mixture was further stirred for 30 minutes. Then, the four-neck flask was refluxed at 80° C. for 4 hours on a mantle heater. A high-hardness silicone resin composition A (alkoxy group 19 wt %, D unit 11.6 mol %, T unit 88.4 mol %, D unit/T unit=0.13) was obtained as a transparent, homogenous and viscous liquid by cooling to room temperature and allowing to stand for 1 hour.

(Curability)

The curability of the silicone resin composition A was evaluated by the following method.

A phosphate-based curing catalyst was obtained by adding 25.93 g of an aqueous orthophosphoric acid (rational formula: $H_3PO_4$) solution ($H_3PO_4$ concentration: 85%) dropwise over 15 minutes while stirring 100.00 g of dimethyldimethoxysilane (DMDMS, rational formula: $(CH_3)_2Si(OCH_3)_2$, molecular weight: 120.2) which had been cooled in an ice bath and then further mixing at room temperature for 1 hour.

After adding the curing catalyst to the silicone resin composition A, 30 µL of the resulting resin composition was dropped on a slide glass using a micropipette. The slide glass was kept at 150° C. for 1 hour and then cooled to room temperature. After vertically standing the slide glass and keeping for 10 minutes, the resin composition was determined to be [cured] because no fluidity was observed.

(IRHD Hardness)

The silicone resin composition A was added to a PFA schale with an inner diameter of 50 mm and an inner height of 12 mm and a cured high-hardness silicone resin with a thickness of about 2 mm was obtained through curing by keeping at 70° C. for 1 hour, keeping at 110° C. for 1 hour and then keeping at 150° C. for 1 hour.

The IRHD hardness of the obtained cured silicone resin was evaluated according to the IRHD-M method using the universal automatic rubber hardness tester Digitest II (M&K).

The IRHD hardness was 97.8.

(Preparation of Silicone Resin Composition B)

A transparent and homogenous high-hardness silicone resin composition B (D unit: 46.0 mol %, T unit 54.0 mol %, D unit/T unit (A)=0.85) was obtained by adding 0.63 g of a 0.5 wt % zirconium octanoate mineral spirit solution to 50.00 g of the alkoxy oligomer b (D unit:T unit (molar ratio)=46.4:53.6) having an organopolysiloxane structure, which is liquid at room temperature, and stirring at room temperature for 1 hour. The silicone resin composition B had a D unit/T unit (molar ratio) of 0.88.

The curability and IRHD hardness of the silicone resin composition B were evaluated in the same manner as for the silicone resin composition A. It showed no fluidity ([cured]) and had an IRHD hardness of 98.9.

(Preparation of Silicone Resin Composition C)

A transparent and homogenous high-hardness silicone resin composition C (T unit 100 mol %, D unit/T unit (A)=0) was obtained by adding 0.50 g of dibutyltin diacetate to 50.00 g of the alkoxy oligomer e (D unit:T unit (molar ratio)=0:100) having an organopolysiloxane structure, which is liquid at room temperature, and stirring at room temperature for 1 hour.

The curability and IRHD hardness of the silicone resin composition C were evaluated in the same manner as for the silicone resin composition A. It showed no fluidity ([cured]) and had an IRHD hardness of 92.1.

(Silicone Resin Composition D)

A transparent and homogenous high-hardness silicone resin composition D (D unit:T unit:Q unit (molar ratio) =52.6:38.0:9.4) was obtained by mixing 50.00 g of an alkoxy oligomer f (D unit:T unit (molar ratio)=58:42), which is liquid at room temperature, with 9.20 g of tetramethoxysilane under stirring, adding 1.18 g of a 0.5 wt % zirconium octanoate mineral spirit solution and then stirring at room temperature for 1 hour.

(Silicone Resin Composition E)

A transparent and homogenous high-hardness silicone resin composition E (M unit:D unit:T unit (molar ratio)=4.6:55.4:40.0) was obtained by mixing 50.00 g of the alkoxy oligomer f (D unit:T unit (molar ratio)=58:42), which is liquid at room temperature, with 2.93 g of trimethoxysilane under stirring, adding 1.06 g of a 0.5 wt % zirconium octanoate mineral spirit solution and then stirring at room temperature for 5 hours.

Example 1

An ultraviolet LED with a configuration shown in FIG. 2 was prepared as follows.

1. Formation of Light-Permeable Buffer Layer

A buffer layer coating solution was prepared by diluting 8.00 g of the silicone resin composition B with 12.00 g of isopropanol.

After applying 100 nL of the buffer layer coating solution on a light-emitting surface 103a of a UV-LED die 103 (1.0 mm long, 1.0 mm wide, 0.1 mm thick) which had been arranged previously on a substrate to be electrically communicable using a dispenser, a light-permeable buffer layer 106 was formed through curing by keeping at room temperature 1 hour, at 70° C. for 1 hour and then at 150° C. for 1 hour. The light-permeable buffer layer 106 had a thickness of 15 μm as measured with LY-111 (Sony Magnescale) and had a smooth surface with no peeling, etc.

2. Formation of Flexible Sealing Layer

An ultraviolet LED 100 was prepared by forming a flexible sealing layer 105 with a truncated conical shape (top diameter 4.0 mm, bottom diameter 6.0 mm, height 2.0 mm) as shown in FIG. 2 by mounting the substrate having the UV-LED die 103 with the light-permeable buffer layer 106 on the surface thereof in a mold, injecting the resin composition K10 into the mold and conducting curing by keeping at 70° C. for 1 hour, at 110° C. for 1 hour and then at 150° C. for 2 hours.

3. Evaluation

For the ultraviolet LED 100 (sealed LED having the light-permeable buffer layer 106 and the flexible sealing layer 105) obtained in 2, ultraviolet light with a peak wavelength of 365 nm was continuously emitted from the light-emitting surface 103a under the condition of a junction temperature ($T_j$) of 120° C. and a forward current of 1,000 mA. The ratio of UV-LED light emission at different times with respect to the initial UV-LED light emission ((UV-LED light emission at different times/initial UV-LED light emission)×100) was recorded.

For comparison, for the same ultraviolet LED 100 having neither light-permeable buffer layer 106 nor flexible sealing layer 105 (unsealed), ultraviolet light with a peak wavelength of 365 nm was continuously emitted from the light-emitting surface 103a under the same condition and the ratio of UV-LED light emission at different times with respect to the initial UV-LED light emission ((UV-LED light emission at different times/initial UV-LED light emission)×100) was recorded.

In addition, the time during which the difference in the maintenance rate of the unsealed LED (ultraviolet LED 100 having neither light-permeable buffer layer 106 nor flexible sealing layer 105) and the maintenance rate of the sealed LED (ultraviolet LED 100 having light-permeable buffer layer 106 and flexible sealing layer 105) is within 5% (maintenance time) was determined as 5400 hours.

In general, a UV-LED with the light-emitting surface sealed with a resin often shows decreased light emission as compared to the unsealed LED because the ultraviolet light can be scattered or blocked as cracks are formed and grown at the sealed area, resulting in decreased maintenance rate. However, it is though that the sealed LED according to Example 1 prevents crack formation and growth at the sealed area due to the presence of the light-permeable buffer layer 106 between the light-emitting surface 103a and the sealed area (flexible sealing layer 105) of the LED die, which prevents the decrease of maintenance rate.

The sealed LED showed no breakage of a wire 104.

Comparative Example 1

A sealed LED (ultraviolet LED 100 sealed only with flexible sealing layer 105) was prepared in the same manner as in Example 1, except that the light-permeable buffer layer 106 was not formed on the UV-LED die 103 which had been arranged previously on a substrate to be electrically communicable, and evaluation was conducted in the same manner as in Example 1. The time during which the difference in the maintenance rate of the unsealed LED (ultraviolet LED 100 having neither light-permeable buffer layer 106 nor flexible sealing layer 105) and the sealed LED is within 5% (maintenance time) was determined as 800 hours.

Figure 3:
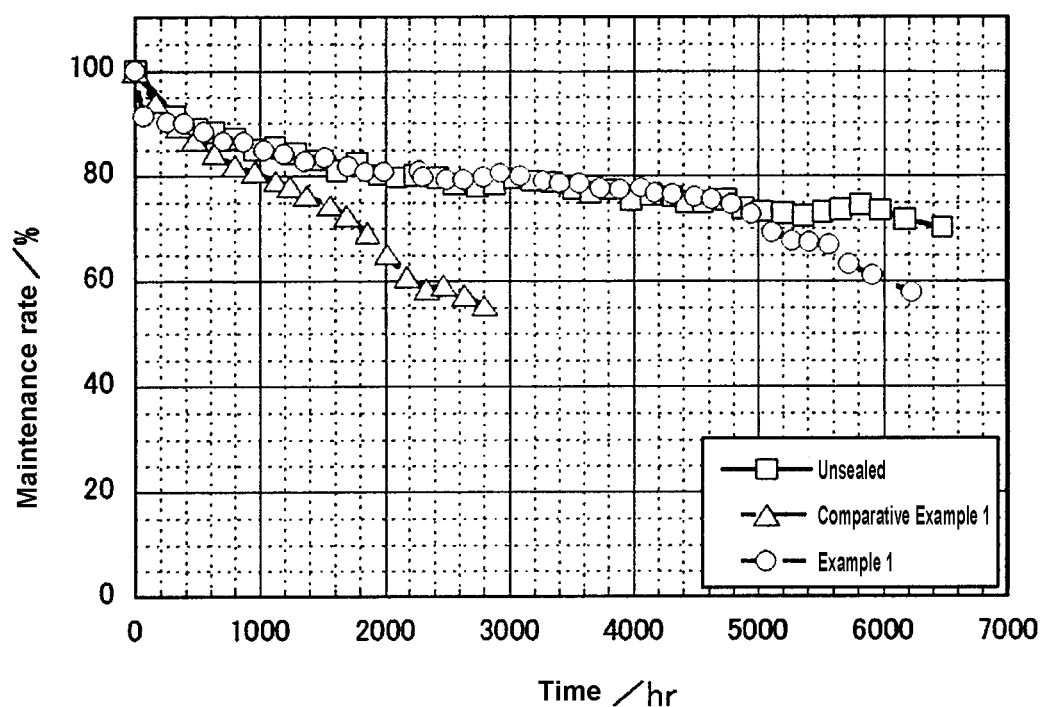
FIG. 3 shows the evaluation result for examples and comparative examples of the present disclosure.

The evaluation result for the sealed LEDs of Example 1 and Comparative Example 1 is shown in FIG. 3.

Examples 2-10

A sealed LED (ultraviolet LED 100 having light-permeable buffer layer 106 and flexible sealing layer 105) was prepared in the same manner as in Example 1, except that a light-permeable buffer layer 106 having a thickness described in Table 4 and having a smooth surface with no peeling, etc. was formed using the silicone resin composition described in Table 4 instead of the silicone resin composition B and a flexible sealing layer 105 was formed using the silicone resin composition described in Table 4 instead of the resin composition K10.

The sealed LED was evaluated in the same manner as in Example 1. The sealed LED showed no breakage of a wire 104.

The result is shown in Table 4.

Comparative Examples 2-10

An ultraviolet LED 100 sealed only with the flexible sealing layer 105 was prepared in the same manner as in Examples 2-10, except that the light-permeable buffer layer 106 was not formed on the UV-LED die 103 which had been arranged previously on a substrate to be electrically communicable, and evaluation was conducted in the same manner as in Example 1.

The sealed LED was evaluated in the same manner as in Example 1. The result is shown in Table 5.

TABLE 4

| | | | Example 1 | Example 2 | Example 3 | Example 4 | Example 5 | Example 6 |
|---|---|---|---|---|---|---|---|---|
| Light-permeable buffer layer | Silicone resin composition | | B | Y4 | X1 | A | K0 | C |
| | Composition | M unit | 0.0 | 0.0 | 0.0 | 0.0 | 0.0 | 0.0 |
| | | D unit | 46.0 | 69.4 | 52.3 | 11.6 | 46.4 | 0.0 |
| | | T unit | 54.0 | 30.6 | 47.7 | 88.4 | 53.6 | 100 |
| | | Q unit | 0.0 | 0.0 | 0.0 | 0.0 | 0.0 | 0.0 |
| | IRHD hardness | | 98.9 | 60.7 | 72.2 | 97.8 | 90.2 | 92.1 |
| | D unit/T unit (A) (molar ratio) | | 0.85 | 2.27 | 1.10 | 0.13 | 0.87 | 0.00 |
| | Thickness (μm) | | 15 | 294 | 175 | 10 | 30 | 1 |
| | Peeling | | None | None | None | None | None | None |
| Flexible sealing layer | Silicon resin composition | | K10 | X9 | X10 | Y10 | Y9 | K9 |
| | Composition | M unit | 0.0 | 0.0 | 0.0 | 0.0 | 0.0 | 0.0 |
| | | D unit | 97.6 | 95.2 | 97.6 | 97.6 | 95.2 | 95.1 |
| | | T unit | 2.4 | 4.8 | 2.4 | 2.4 | 4.8 | 4.9 |
| | | Q unit | 0.0 | 0.0 | 0.0 | 0.0 | 0.0 | 0.0 |
| | IRHD hardness | | 4.2 | 9.7 | 3.5 | 3.1 | 9.4 | 7.3 |
| | D unit/T unit (B) (molar ratio) | | 40.3 | 19.7 | 40.6 | 40.8 | 19.8 | 19.5 |
| IRHD hardness ratio (light-permeable buffer layer/flexible sealing layer) | | | 23.5 | 6.3 | 20.6 | 31.5 | 9.6 | 12.6 |
| Molar ratio (A)/molar ratio (B) | | | 0.021 | 0.12 | 0.027 | 0.0032 | 0.044 | 0.00 |
| Maintenance rate (maintenance time (hr)) | | | 5400 | 5000 | 5000 | 5500 | 4500 | 3000 |

| | | | Example 7 | Example 8 | Example 9 | Example 10 |
|---|---|---|---|---|---|---|
| Light-permeable buffer layer | Silicone resin composition | | K2 | K1 | D | E |
| | Composition | M unit | 0.0 | 0.0 | 0.0 | 4.6 |
| | | D unit | 58.1 | 52.3 | 52.6 | 55.4 |
| | | T unit | 41.9 | 47.7 | 38.0 | 40.0 |
| | | Q unit | 0.0 | 0.0 | 9.4 | 0.0 |
| | IRHD hardness | | 67.6 | 71.5 | 78.3 | 60.2 |
| | D unit/T unit (A) (molar ratio) | | 1.38 | 1.10 | 1.39 | 1.39 |
| | Thickness (μm) | | 5 | 150 | 26 | 23 |
| | Peeling | | None | None | None | None |
| Flexible sealing layer | Silicon resin composition | | K9 | Y10 | K9 | K9 |
| | Composition | M unit | 0.0 | 0.0 | 0.0 | 0.0 |
| | | D unit | 95.1 | 97.6 | 95.1 | 95.1 |
| | | T unit | 4.9 | 2.4 | 4.9 | 4.9 |
| | | Q unit | 0.0 | 0.0 | 0.0 | 0.0 |
| | IRHD hardness | | 7.3 | 3.1 | 7.3 | 7.3 |
| | D unit/T unit (B) (molar ratio) | | 19.5 | 40.8 | 19.58 | 19.5 |
| IRHD hardness ratio (light-permeable buffer layer/flexible sealing layer) | | | 9.2 | 23.1 | 10.7 | 8.2 |
| Molar ratio (A)/molar ratio (B) | | | 0.0708 | 0.0269 | 0.0709 | 0.0709 |
| Maintenance rate (maintenance time (hr)) | | | 5100 | 4800 | 4400 | 4000 |

TABLE 5

|  |  |  | Comparative Example 1 | Comparative Example 2 | Comparative Example 3 | Comparative Example 4 | Comparative Example 5 | Comparative Example 6 |
|---|---|---|---|---|---|---|---|---|
| Light-permeable buffer layer | Silicon resin composition |  | — | — | — | — | — | — |
|  | Composition | M unit | — | — | — | — | — | — |
|  |  | D unit | — | — | — | — | — | — |
|  |  | T unit | — | — | — | — | — | — |
|  |  | Q unit | — | — | — | — | — | — |
|  | IRHD hardness |  | — | — | — | — | — | — |
|  | D unit/T unit (A) (molar ratio) |  | — | — | — | — | — | — |
|  | Thickness (μm) |  | — | — | — | — | — | — |
|  | Peeling |  | — | — | — | — | — | — |
| Flexible sealing layer | Silicone resin composition |  | K10 | X9 | X10 | Y10 | Y9 | K9 |
|  | Composition | M unit | 0.0 | 0.0 | 0.0 | 0.0 | 0.0 | 0.0 |
|  |  | D unit | 97.6 | 95.2 | 97.5 | 97.6 | 95.2 | 95.1 |
|  |  | T unit | 2.4 | 4.8 | 2.4 | 2.4 | 4.8 | 4.9 |
|  |  | Q unit | 0.0 | 0.0 | 0.0 | 0.0 | 0.0 | 0.0 |
|  | IRHD hardness |  | 4.2 | 9.7 | 3.5 | 3.1 | 9.4 | 7.3 |
|  | D unit/T unit (B) (molar ratio) |  | 40.3 | 19.7 | 40.6 | 40.8 | 19.8 | 19.5 |
| IRHD hardness ratio (light-permeable buffer layer/flexible sealing layer) |  |  | 23.5 | 6.3 | 20.6 | 31.5 | 9.0 | 12.6 |
| Molar ratio (A)/molar ratio (B) |  |  | — | — | — | — | — | — |
| Maintenance rate (maintenance time (hr)) |  |  | 800 | 800 | 950 | 900 | 850 | 900 |

|  |  |  | Comparative Example 7 | Comparative Example 8 | Comparative Example 9 | Comparative Example 10 |
|---|---|---|---|---|---|---|
| Light-permeable buffer layer | Silicon resin composition |  | — | — | — | — |
|  | Composition | M unit | — | — | — | — |
|  |  | D unit | — | — | — | — |
|  |  | T unit | — | — | — | — |
|  |  | Q unit | — | — | — | — |
|  | IRHD hardness |  | — | — | — | — |
|  | D unit/T unit (A) (molar ratio) |  | — | — | — | — |
|  | Thickness (μm) |  | — | — | — | — |
|  | Peeling |  | — | — | — | — |
| Flexible sealing layer | Silicone resin composition |  | K9 | Y10 | K9 | K9 |
|  | Composition | M unit | 0.0 | 0.0 | 0.0 | 0.0 |
|  |  | D unit | 95.1 | 97.6 | 95.1 | 95.1 |
|  |  | T unit | 4.9 | 2.4 | 4.9 | 4.9 |
|  |  | Q unit | 0.0 | 0.0 | 0.0 | 0.0 |
|  | IRHD hardness |  | 7.3 | 3.1 | 7.3 | 7.3 |
|  | D unit/T unit (B) (molar ratio) |  | 19.5 | 40.8 | 19.5 | 19.5 |
| IRHD hardness ratio (light-permeable buffer layer/flexible sealing layer) |  |  | 9.2 | 23.1 | 10.7 | 8.2 |
| Molar ratio (A)/molar ratio (B) |  |  | — | — | — | — |
| Maintenance rate (maintenance time (hr)) |  |  | 900 | 900 | 850 | 850 |

Comparative Example 11

A sealed LED (ultraviolet LED 100 having light-permeable buffer layer 106 and flexible sealing layer 105) was prepared in the same manner as in Example 1, except that a light-permeable buffer layer 106 having a thickness of 0.5 μm and having a smooth surface with no peeling, etc. was formed using the silicone resin composition B and a flexible sealing layer 105 was formed using the silicone resin composition K9 instead of the resin composition K10.

The sealed LED was evaluated in the same manner as in Example 1. The sealed LED showed no breakage of a wire 104. The time during which the difference in the maintenance rate of the unsealed LED (ultraviolet LED 100 having neither light-permeable buffer layer 106 nor flexible sealing layer 105) and the sealed LED is within 5% (maintenance time) was determined as 900 hours.

The result is shown in Table 6.

Comparative Example 12

A light-permeable buffer layer was formed in the same manner as in Example 1, except that the thickness of the light-permeable buffer layer formed using the silicone resin composition B was changed to 350 μm. A smooth surface could not be formed as peeling occurred on the surface.

Also, a sealed LED (ultraviolet LED 100 having light-permeable buffer layer 106 and flexible sealing layer 105) was prepared in the same manner as in Example 1, except that a flexible sealing layer 105 was formed on the light-permeable buffer layer using the silicone resin composition K9 instead of the resin composition K10.

The sealed LED was evaluated in the same manner as in Example 1. The time during which the difference in the maintenance rate of the unsealed LED (ultraviolet LED 100 having neither light-permeable buffer layer 106 nor flexible sealing layer 105) and the sealed LED is within 5% (maintenance time) was determined as 950 hours.

The result is shown in Table 6.

Comparative Example 13

An ultraviolet LED 100 sealed only with a sealing layer formed of a cured product the silicone resin composition A by using the silicone resin composition A instead of the silicone resin composition Y10.

The sealed LED was evaluated in the same manner as in Example 1. The time during which the difference in the maintenance rate of the unsealed LED (ultraviolet LED 100 having neither light-permeable buffer layer 106 nor flexible sealing layer 105) and the sealed LED is within 5% (maintenance time) was determined as 600 hours and light was not emitted 1100 hours after the onset of the lighting. When the sealed LED which did not emit light was observed, it was found out that the crack occurred in the sealed area was propagated to the bonding wire, resulting in the breakage of the bonding wire.

TABLE 6

| | | | Comparative Example 11 | Comparative Example 12 | Comparative Example 13 |
|---|---|---|---|---|---|
| Light-permeable buffer layer | Silicone resin composition | | B | B | A |
| | Composition | M unit | 0.0 | 0.0 | 0.0 |
| | | D unit | 46.0 | 46.0 | 11.6 |
| | | T unit | 54.0 | 54.0 | 88.4 |
| | | Q unit | 0.0 | 0.0 | 0.0 |
| | IRHD hardness | | 98.9 | 98.9 | 97.8 |
| | D unit/T unit (A) (molar ratio) | | 0.85 | 0.85 | 0.13 |
| | Thickness (μm) | | 0.5 | 350 | — |
| | Peeling | | None | Exist | — |
| Flexible sealing layer | Silicone resin composition | | K9 | K9 | A |
| | Composition | M unit | 0.0 | 0.0 | 0.0 |
| | | D unit | 95.1 | 95.1 | 11.6 |
| | | T unit | 4.9 | 4.9 | 88.4 |
| | | Q unit | 0.0 | 0.0 | 0.0 |
| | IRHD hardness | | 7.3 | 7.3 | 97.8 |
| | D unit/T unit (B) (molar ratio) | | 19.5 | 19.5 | 0.13 |
| IRHD hardness ratio (light-permeable buffer layer/flexible sealing layer) | | | 13.5 | 13.5 | — |
| Molar ratio (A)/molar ratio (B) | | | 0.044 | 0.044 | — |
| Maintenance rate (maintenance time (hr)) | | | 900 | 950 | 800 |

From Table 4, etc., it can be seen that, for the ultraviolet LEDs of Examples 1-10, wherein the light-permeable buffer layer formed of the cured high-hardness silicone resin is provided on the light-emitting surface of the LED die with a specific thickness, stress occurring in the wire due to the cured high-hardness silicone resin can be reduced by minimizing the contact area with the wire. In addition, the breakage of the wire electrically connected to the optical semiconductor device can be significantly prevented while exerting superior heat resistance and UV resistance with long maintenance time because the flexible sealing layer provided on the light-permeable buffer layer can improve heat resistance and UV resistance.

From Table 5, it can be seen that the ultraviolet LEDs of Comparative Examples 1-10, wherein the flexible sealing layer is provided directly on the light-emitting surface of the LED die without providing a light-permeable buffer layer formed of a cured high-hardness silicone resin, show unsatisfactory heat resistance and UV resistance and short maintenance time.

From Table 6, it can be seen that, for the ultraviolet LEDs of Comparative Example 11 and Comparative Example 12, the improvement in heat resistance and UV resistance by the flexible sealing layer provided on the light-permeable buffer layer cannot be achieved because the thickness of the light-permeable buffer layer provided on the light-emitting surface of the LED die is too small (Comparative Example 11), or ultraviolet light can be easily scattered or blocked due to peeling because the thickness of the light-permeable buffer layer provided on the light-emitting surface of the LED die is too large (Comparative Example 12). In addition, the maintenance time is also short.

And, it can be seen that, for the ultraviolet LED obtained in Comparative Example 13, which is sealed only with the cured high-hardness silicone resin composition A, the crack that occurred in the sealed area was propagated to the bonding wire, resulting in the breakage of the bonding wire.

INDUSTRIAL APPLICABILITY

According to the present disclosure, by providing the light-permeable buffer layer containing the cured high-hardness silicone resin on the optical semiconductor device with a specific thickness, stress occurring in the wire due to the cured high-hardness silicone resin can be reduced by minimizing the contact area with the wire while exerting heat resistance and UV resistance. Therefore, the breakage of the wire electrically connected to the optical semiconductor device can be significantly prevented while exerting superior heat resistance and UV resistance.

DETAILED DESCRIPTION OF MAIN ELEMENTS

100: ultraviolet LED
101: substrate
102a: electrode pattern
102b: electrode pattern
103: LED die
104: bonding wire
105: flexible sealing layer
106: light-permeable buffer layer

The invention claimed is:

1. An optical semiconductor apparatus, comprising, in the order recited:
   an optical semiconductor device that has a surface that emits light;
   a buffer layer that is light-permeable, that comprises a first silicone resin that is cured and has a high-hardness, that has a thickness ranging from 1 μm to 300 μm, and that covers at least part of the surface of the optical semiconductor device that emits light;
   a sealing layer that is flexible, that comprises a second silicone resin which is cured and which has a hardness that is lower than that of the buffer layer, and that covers the optical semiconductor device and the buffer layer.

2. The optical semiconductor apparatus according to claim 1, wherein the optical semiconductor device has an electrode installed on at least part of the surface that emits light, and wherein a wire is electrically connected to the electrode.

3. The optical semiconductor apparatus according to claim 2, wherein the buffer layer has an IRHD hardness of 60 or higher and the sealing layer has an IRHD hardness of 20 or lower.

4. The optical semiconductor apparatus according to claim 3, wherein a ratio of the IRHD hardness of the buffer layer to the IRHD hardness of the sealing layer is 6 or greater.

5. The optical semiconductor apparatus according to claim 2, wherein the buffer layer and the sealing layer each have a respective IRHD hardness, and wherein a ratio of the IRHD hardness of the buffer layer to the IRHD hardness of the sealing layer is 6 or greater.

6. The optical semiconductor apparatus according to claim 1, wherein the buffer layer has an IRHD hardness of 60 or higher and the sealing layer has an IRHD hardness of 20 or lower.

7. The optical semiconductor apparatus according to claim 6, wherein a ratio of the IRHD hardness of the buffer layer to the IRHD hardness of the sealing layer is 6 or greater.

8. The optical semiconductor apparatus according to claim 1, wherein the buffer layer and the sealing layer each have a respective IRHD hardness, and wherein a ratio of the IRHD hardness of the buffer layer to the IRHD hardness of the sealing layer is 6 or greater.

9. The optical semiconductor apparatus according to claim 1, wherein the sealing layer has a shape that mirrors that of the optical semiconductor device.

10. The optical semiconductor apparatus according to claim 1, which emits ultraviolet light with a peak emission wavelength shorter than 395 nm.

11. An optical semiconductor apparatus, comprising:
an optical semiconductor device that has a light emitting surface;
a light-permeable buffer layer that comprises a cured high-hardness silicone resin, that has a thickness ranging from 1 μm to 300 μm, and that covers at least part of the light-emitting surface of the optical semiconductor device; and
a flexible sealing layer that comprises a cured flexible silicone resin having a lower hardness than that of the light-permeable buffer layer, and that covers the optical semiconductor device and the light-permeable buffer layer,
wherein the cured flexible silicone resin or the cured high-hardness silicone resin is a cured alkoxy oligomer having an organopolysiloxane structure which is liquid at room temperature,
wherein the alkoxy oligomer has, as an essential constituent, a structural unit selected from the group consisting of:
a structural unit represented by general formula (1) below, $(R^1R^2R^3SiO_{1/2})$ (1), where each of $R^1$, $R^2$ and $R^3$ is the same or a different organic group,
a structural unit represented by general formula (2) below, $(R^4R^5SiO_{2/2})$ (2), where each of $R^4$ and $R^5$ is the same or a different organic group,
a structural unit represented by general formula (3) below, $(R^6SiO_{3/2})$ (3), and where $R^6$ is an organic group, and
a structural unit represented by the general formula (4)

$(SiO_{4/2})$ (4), and wherein the alkoxy oligomer has, as an optional constituent, one or more structural unit selected from the group consisting of:
a structural unit represented by general formula (5) below, $(R^7{}_a(OR^8)_{3-a}SiO_{1/2})$ (5), where a is 0, 1 or 2 and each of $R^7$ and $R^8$ is the same or a different organic group, with the proviso that, if $R^7$ or $R^8$ is plural, the respective $R^7$ or $R^8$ may be identical to or different from each other,
a structural unit represented by general formula (6) below, $(R^9{}_b(OR^{10})_{2-b}SiO_{2/2})$ (6), where b is 0 or 1 and each of $R^9$ and $R^{10}$ is the same or a different organic group, with the proviso that, if $R^{10}$ is plural, the respective $R^{10}$ may be identical to or different from each other, and
a structural unit represented by general formula (7) below, $((OR^{11})SiO_{3/2})$ (7), where $R^{11}$ is an organic group.

12. The optical semiconductor apparatus according to claim 11, wherein the alkoxy oligomer comprises 0-5 mol % of the structural unit represented by the general formula (1), 0-70 mol % of the structural unit represented by the general formula (2), 30-100 mol % of the structural unit represented by the general formula (3), and 0-10 mol % of the structural unit represented by the general formula (4) based on 100 mol % of total siloxane units of the alkoxy oligomer forming the cured high-hardness silicone resin.

13. The optical semiconductor apparatus according to claim 12, wherein A represents a ratio of moles of the structural unit represented by the general formula (2) to moles of the structural unit represented by the general formula (3) in the structural units of the alkoxy oligomer forming the cured high-hardness silicone resin,
wherein B represents a ratio of moles of the structural unit represented by the general formula (2) to moles of the structural unit represented by the general formula (3) in the structural units of the alkoxy oligomer forming the cured flexible silicone resin, and
wherein a ratio of A to B is 0.13 or smaller.

14. The optical semiconductor apparatus according to claim 13, wherein one or more organic group selected from the group consisting of $R^1,R^2,R^3,R^4,R^5,R^6,R^7,R^8,R^9,R^{10}$ and $R^{11}$ is a methyl group.

15. The optical semiconductor apparatus according to claim 12, wherein one or more organic group selected from the group consisting of $R^1, R^2,R^3,R^4,R^5, R^6,R^7,R^8,R^9,R^{10}$ and $R^{11}$ is a methyl group.

16. The optical semiconductor apparatus according to claim 11, wherein A represents a ratio of moles of the structural unit represented by the general formula (2) to moles of the structural unit represented by the general formula (3) in the structural units of the alkoxy oligomer forming the cured high-hardness silicone resin,
wherein B represents a ratio of moles of the structural unit represented by the general formula (2) to moles of the structural unit represented by the general formula (3) in the structural units of the alkoxy oligomer forming the cured flexible silicone resin, and wherein a ratio of A to B is 0.13 or smaller.

17. The optical semiconductor apparatus according to claim 16, wherein one or more organic group selected from the group consisting of $R^1$, $R^2, R^3, R^4, R^5, R^6, R^7, R^8, R^9, R^{10}$ and $R^{11}$ is a methyl group.

18. The optical semiconductor apparatus according to claim 11, wherein one or more organic group selected from the group consisting of $R^1$, $R^2, R^3, R^4, R^5, R^6, R^7, R^8, R^9$, $R^{10}$ and $R^{11}$ is a methyl group.

19. An optical semiconductor apparatus, comprising:
an optical semiconductor device that has a light emitting surface;
a light-permeable buffer layer that comprises a cured high-hardness silicone resin, that has a thickness ranging from 1 μm to 300 μm, and that covers at least part of the light-emitting surface of the optical semiconductor device; and
a flexible sealing layer that comprises a cured flexible silicone resin having a lower hardness than that of the light-permeable buffer layer, and that covers the optical semiconductor device and the light-permeable buffer layer, wherein the light-permeable buffer layer is formed of a cured product of a solution comprising an alkoxy oligomer having an organopolysiloxane structure which forms the cured high-hardness silicone resin, and wherein the solution comprising the alkoxy oligomer does not show fluidity when provided for a curing test of
(a) dropping 30 μL of the solution on a glass substrate,
(b) keeping the glass substrate at 150° C. for 1 hour,
(c) cooling the heat-treated glass substrate to room temperature, and
(d) vertically standing the glass substrate and keeping for 10 minutes.

* * * * *